(12) United States Patent
Matsuo et al.

(10) Patent No.: US 6,811,672 B2
(45) Date of Patent: Nov. 2, 2004

(54) METHOD FOR FORMING PLATING FILM AND ELECTRONIC COMPONENT HAVING PLATING FILM FORMED THERON BY SAME METHOD

(75) Inventors: Yoshihiko Matsuo, Yamatotakada (JP); Ryukichi Ikeda, Kitakyushu (JP); Kimihiko Yoshida, Kiyakyushu (JP); Fumio Okuda, Simonoseki (JP)

(73) Assignees: Sharp Kabushiki Kaisha, Osaka (JP); Kobe Leadmikk Co., Ltd., Fukuoka (JP)

( * ) Notice: Subject to any disclaimer, the term of this patent is extended or adjusted under 35 U.S.C. 154(b) by 157 days.

(21) Appl. No.: 10/178,304

(22) Filed: Jun. 25, 2002

(65) Prior Publication Data
US 2003/0003320 A1 Jan. 2, 2003

(30) Foreign Application Priority Data

Jun. 27, 2001 (JP) .................................. 2001-194740
Feb. 28, 2002 (JP) .................................. 2002-054336

(51) Int. Cl.$^7$ ............................................. C25D 3/56
(52) U.S. Cl. .................. 205/238; 205/170; 205/176; 205/252; 205/253; 205/300; 205/704; 205/799
(58) Field of Search .................................. 205/238, 170, 205/176, 252, 253, 300, 704, 799

(56) References Cited

U.S. PATENT DOCUMENTS 4,319,967 A * 3/1982 Vratny et al. ............... 205/170

FOREIGN PATENT DOCUMENTS

JP          2000-26994 A       1/2000

* cited by examiner

Primary Examiner—Robert R. Koehler
(74) Attorney, Agent, or Firm—Nixon & Vanderhye, P.C.

(57) ABSTRACT

A method for forming a plating film, comprising the steps of: applying a plating film onto an object to be plated at a first current density for a predetermined period in a plating bath having a cathode capable of varying current and an anode and; and maintaining the object to be plated at a second current density lower than the first current density. According to the present invention, it is possible to improve solderability of a plating film for conventional lead-free solder by a simple method, which allows the productivity to further enhanced, resulting in a plating film with reduced production costs.

13 Claims, 6 Drawing Sheets

SnCu plating film of the invention (after PCT)

thicker portion is Cu or SnCu alloy (max. particle diameter 1 μm)

Conventional SnCu plating film (after PCT)

thicker portion is Cu or SnCu alloy (max. particle diameter 4 μm)

METHOD FOR FORMING PLATING FILM AND ELECTRONIC COMPONENT HAVING PLATING FILM FORMED THERON BY SAME METHOD

CROSS-REFERENCES TO RELATED APPLICATIONS

This application is related to Japanese applications Nos. 2001-194740 and 2002-054336, filed on Jun. 27, 2001 and Feb. 28, 2002 whose priorities are claimed under 35 USC § 119, the disclosures of which are incorporated by reference in their entirety.

BACKGROUND OF THE INVENTION

1. Field of the Invention

The present invention relates to a method for forming a plating film and to an electronic component having a plating film formed thereon by the same method. More particularly, the present invention relates to a method for forming a plating film which is lead-free and excellent in solderability and to an electronic component having a plating film formed thereon by the same method.

2. Description of Related Art

In the field of the electric and electronic industries, where soldering is generally used for formation of circuits, an Sn—Pb containing alloy is typically used as a soldering material and for rapid and ensured soldering, a plating film of the SnPb-containing alloy is applied onto an object to be soldered before hand.

For example, as shown in FIG. 7, a photo coupled semiconductor device 40, which utilizes soldering, is constituted as follows. A light emitting element 42 and a photoreceptor 43 are connected to headers of lead frames 41, respectively, by die bonding. The lead frames 41 are made of a metal such as a Cu alloy or Fe alloy and are bent in advance. The light emitting element 42 and the photoreceptor 43 are connected to the adjacent lead frames 41, respectively, by wire bonding using gold wires 48. The light emitting element 42 is precoated with resin 44. The lead frames 41 having the light emitting element 42 and the photoreceptor 43 connected thereto by die bonding are positioned and opposed to each other by spot welding or using a loading frame set, and an inner package is formed by primary transfer molding using a light transmitting epoxy resin 45. Further, an outer package is formed by secondary transfer molding using a light shielding epoxy resin 46, and a non-glossy (non-shiny or lusterless) SnPb plating film is applied onto portions of the lead frames 41 extending outside the outer package.

Thus, SnPb, which is inexpensive, has a low melting point, and is excellent in processibility, has been used as a material for soldering and also as a material for a plating film. In recent years, however, it becomes urgent to replace SnPb by a material which does not contain lead (lead-free material), as an environmental protection measure. Examples of such a material for soldering include an alloy containing tin as a principal component together with one or more selected from silver, bismuth, copper, zinc and the like, and examples of such a material for a plating film include an alloy containing tin as a principal component together with one or more selected from silver, bismuth, copper, zinc and the like; gold; silver; palladium; and the like.

Japanese Unexamined Patent Publication No. 2000-26994 proposes an SnCu plating coat layer whose cryatal on a surface is fined so that the surface is in a gloss state or a half gloss state.

However, it has been found that a plating coat layer as mentioned above has a zero cross time of 5 seconds or more, indicating that the coat layer is poor in solderability and appearance when the solderability of the plating coat layer is evaluated by a meniscograph method by immersing a component which has the coat layer as mentioned above into a soldering bath filled with a soldering alloy comprising Sn—Ag (3.5%) at 270° C., at a predetermined rate and to a predetermined depth for five minutes and then picking it upward.

BRIEF SUMMARY

The present invention provides a method for forming a plating film, comprising the steps of: applying a plating film onto an object to be plated at a first density for a predetermined period in a plating bath having a cathode and an anode and capable of varying current and maintaining the object to be plated at a second current density lower than the first current density or immersing the object to be plated into a solution containing 5 to 10% wt of trisodium phosphate.

Further, the present invention provides an electronic component having a plating film formed thereon by the above method.

According to the present invention, it is possible to improve solderability of a plating film for conventional lead-free solder by a simple method, which allows the productivity to further enhanced, resulting in a plating film with reduced production costs.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
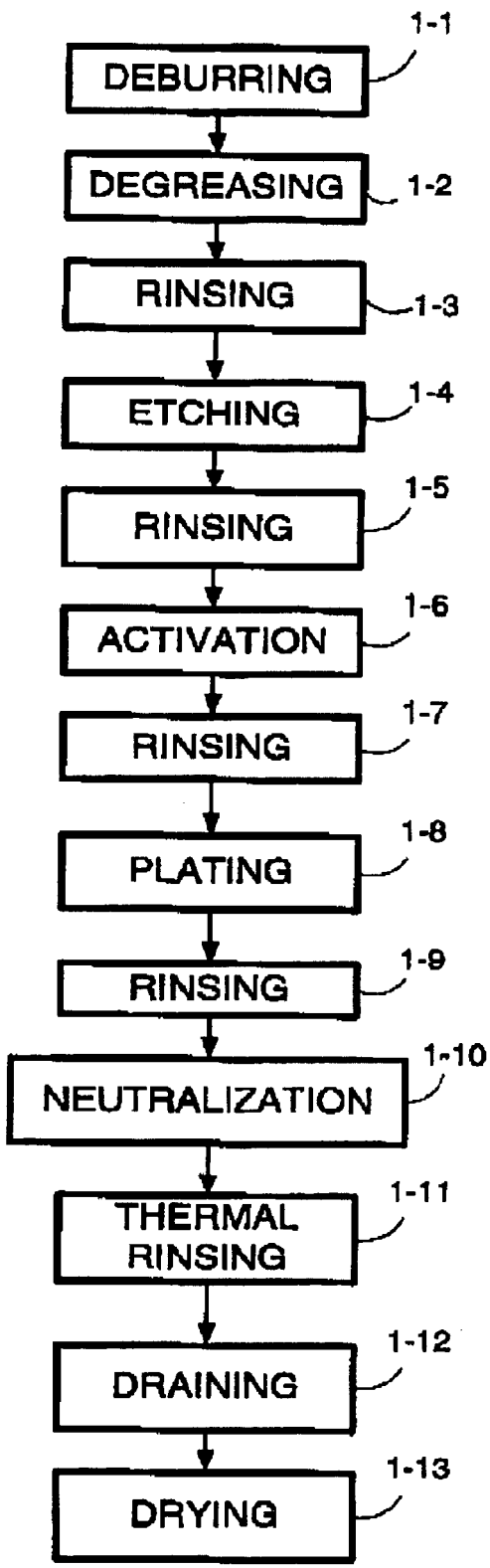
FIG. 1 is a flowchart showing an embodiment of a method for forming a plating film in accordance with the present invention.

The method for forming a plating film in accordance with the present invention includes the step of applying a plating film onto an object to be plated at a first current density for a predetermined period in a plating bath having a cathode capable of varying current and an anode.

The object to be plated in accordance with the present invention is not particularly limited, and may be any member as long as it is formed of a conductive material and may be made of any material, size and shape. Examples are an electronic device and a passive element such as an IC semiconductor device, a photo coupled semiconductor device, a light emitting element, a photoreceptor, a solid-state relay, a regulator, a resistor, a condenser, a photointerruptor or the like; and a connecting element such as a connector, a switch, a printed circuit board, a resin-laminated semiconductor substrate, a lead frame or the like. Preferably, these members are of the shape of a plate with or without an even surface.

A plating solution contained in the plating bath in accordance with the present invention is not particularly limited, and may be of any composition. Preferably, the plating solution does not contain lead. Further, preferably it does not contain cyanide. An example of a plating solution employed is a plating solution constituting a known acidic bath or a complex salt bath to which a complexing agent is added.

Specific examples are inorganic acids including sulfuric acid, hydrogen halide, sulfamic acid, phosphoric acid and pyrophosphoric acid; carboxylic acids including acetic acid, succinic acid, glycolic acid and citric acid; hydroxycarboxylic acids and amino acids, dervatives thereof and the like; amine carboxylic acids including ethylenediamintetraacetic acid and iminodiacetic acid; hydroxyalkane bisphosphonic acids including 1-hydroxyethane-1,1-bisphosphonic acid; aliphatic and aromatic organic sulfonic acids including methane sulfonic acid and 2-hydroxypropane sulfonic acid; mercapto compounds including thioglycolic acid and acetylcysteine; and sulfur-containing compounds including thiourea and trimethylthiourea.

Examples of a source of metallic ions constituting the plating bath are salts and complexes of tin, copper, silver, bismuth, indium, antimony, zinc, gold, palladium and the like; and complexes of the above-mentioned acids and complexing agents. Among these, salts and complexes of tin or copper are preferable.

The concentration of a metal, concentration of a free acid, pH, temperature, and kind and concentration of an additive, of a plating solution may be properly adjusted. The concentration of a metal of a plating solution, for example, may be 1 to 100 g/l.

The additive of a plating solution may be properly selected in accordance with the kind of the plating solution, and may be a nonionic, cationic, anionic or ampholytic surfactant, for example. The surfactant may be any known surfactant.

Also, any known substance used as a smoothing agent or brightener may be added. Examples are high molecular compounds including gelatin, peptone, polyethylene glycol and polyacrylamide; derivatives of sulfanilic acid including N-butylidenesulfanilic acid and aldol, and salts thereof; triazoles including benzotriazole and 4-hydroxybenzotriazole, and derivatives thereof; benzothiazoles including benzothiazole and 2-methylbenzothiazole, and derivatives thereof; imines; triazines including 2,4-diamino-6-[2'-methylimidazolyl(1')ethyl-1,3,5-triazine and 2,4-diamino-6-[2'-ethylimidazolyl(1')ethyl-1,3,5-triazine; esters of aromatic hydroxycarboxylic acid including o-(or m- or p-)methyl benzoate and phenyl salicylate; aldehydes including formaldehyde and acetaldehyde; diketones including glyoxal and diacetyl; aniline derivatives including aniline and o-(or m- or p-)toluidine; mercaptocarboxylic acids including thioglycolic acid and mercaptosuccinic acid; amine alcohols including triethanolamine and diethanolamine; aliphatic primary and secondary amines; compounds having conjugated double bond including acrylic acid and methacrylic acid. Further, such an antioxidant as resorcinol, pyrocatechol, hydroquinone, phloroglucinol, pyrogallol, hydrazine or ascorbic acid may be added.

The plating bath has a pair of cathode and anode, or a plurality of cathodes and a plurality of anodes therein. The number, size, shape and the like of the cathode and anode are not particularly limited and may be properly adjusted. Preferably, the plating bath has a plurality of cathodes and a plurality of anodes therein. Suitably, the anode is of the shape of a plate made of tin, SnCu or the like, for example. Suitably, the cathode is made of a material in the form of a plate-shaped or frame-shaped rack which allows electric current to flow effectively through the object to be plated so as to serve as a cathode together with the object to be plated. The cathode needs to be so constituted as to be capable of varying current.

The object to be plated is treated at a first current density for a predetermined period in the plating bath having the cathode and anode as mentioned above to plate. The predetermined period here is not specifically limited, and may be properly adjusted in accordance with the thickness of a plating film to be obtained, current density or the like. The predetermined period may be about 5 to 10 minutes, and preferably about 7 to 8 minutes, for example. The first current density may be properly adjusted in accordance with the thickness of a plating film to be obtained, period for plating or the like. The first current density may be about 0.1 to 20 A/dm$^2$, and preferably about 1 to 10 A/dm$^2$, for example. Specifically, where a plating film of a thickness of about 8 to 20 μm is intended, the object to be plated may be treated at the first current density of about 1 to 5 A/dm$^2$, and preferably about 1.5 to 4.5 A/dm$^2$, for a period of about 7 to 8 minutes.

In the present invention, any type of plating method may be employed. For example, a continuous line type, carrier over type plating method (in which a plating bath is divided into a plurality of sections, and an object to be plated is picked upward from a section and transferred into an adjacent section, and this operation is repeated) and the like may be mentioned. Among these, the continuous line type plating method is suitably used from the standpoint of efficiency and production costs. Specifically, it is preferably used as follows. That is, a plurality of cathodes (hereafter, referred to as racks) each in the form of a rack, for example, are supplied continuously at predetermined intervals into a plating bath where a plurality pair of anodes are provided at predetermined intervals. Each rack on which a plurality of objects to be plated are carried longitudinally and/or transversely is immersed at a predetermined region (cathode region) between a pair of anodes while electric power is supplied to plate at the region for a predetermined period; and then transferred to an adjacent cathode region to again plate. Where the carrier over type plating method is employed, it is suitable to station a rack in a bath while supplying electric power for a predetermined period, in place of transferring the rack at a predetermined rate. The objects to be plated may be arranged such that its principal surface on which a plating film is to be formed is horizontal, perpendicular or oblique to a principal surface of an anode. Preferably, the objects to be plated are carried on the rack so as to make an tilt angle of about 5 to 85°, and preferably 45 to 85°, with respect to the anode. The tilt angle here means a tilt angle made between the principal surface of the object to be plated on which the plating film is to be formed and the principal surface of the anode so that the principal surface of the object to be plated is horizontal, perpendicular or oblique to the principal surface of the anode (see FIGS. 5(a), 6(a) and (b)). Where a plurality of objects to be plated which are disposed close to one another are opposed to the anode, it is preferable that, in a projection area of the objects to be plated to the anode, an overlap area of two adjacent objects to be plated makes up a third or less of all the projection area of one object to be plated.

Subsequently, the object to be plated is maintained at a second current density lower than the first current density. The second current density is not particularly limited if it is lower than the first current density, and may be about 0.5 to 4.5 A/dm$^2$, and preferably about 1.5 to 2.5 A/dm$^2$, for example. The maintaining period here may be properly adjusted in accordance with the thickness and material of a plating film, current density or the like, and may be about 5 to 10 minutes, and preferably about 7 to 8 minutes, for example. Where the method for forming a plating film of the present invention is implemented by the above-mentioned continuous type plating method, it is preferable to transfer the plurality of cathodes each of which carries a plurality of objects to be plated at a rate of about 0.5 to 5 cm/sec. and preferably about 1.0 to 3.5 cm/sec., in accordance with the length of a plating bath and to change the density of electric current flowing of the cathodes to the second density at a last cathode region, i.e., a region where a rack having objects to be plated passes through between a last pair of anodes in the plating bath. The application of the second current density allows a previously obtained plating film to have a dense and even surface while thickening it slightly.

Also, in accordance with the present invention, it is preferable to neutralize after the plating film is applied, in place of maintaining the plating film at the second current density lower than the first current density. Preferably, this neutralization is carried out after the plating solution is washed with water after the application of the plating film. The neutralization here can be carried out by immersing the object to be plated into an organophosphorus treating agent, specifically a trisodium phosphate solution, for example. The concentration of the organophosphorus treating agent here may be about 5 to 10 wt %, and temperature thereof may be about 25 to 65° C., and preferably about 55 to 65° C. The period for immersion may be about 10 to 60 seconds, and preferably about 20 to 40 seconds.

The neutralization may be carried out in the same manner as mentioned above after the object to be plated is maintained at the second current density, and preferably after the plating solution is rinsed after the object to be plated is maintained at the second current density.

Also, in the method for forming a plating film in accordance with the present invention, optionally, the abovemention process may follow or be followed by such treating processes known in the art as formation of an underlying film, degreasing, rinsing, etching, activation using acid, thermal rinsing, draining, drying and further formation of a film. The formation of an underlying film, for example, means formation of a film of a nickel, nickel alloy, copper, copper alloy or the like film on the object to be plated by electroplating or non-electrolytic plating before the formation of a plating film as mentioned above. The further formation of a film means formation of a single-layered film or a laminate films of gold, silver, palladium, bismuth, antimony, indium or the like, or an alloy of two or more of these metals.

The electronic component in accordance with the present invention has a non-glossy plating film formed on a surface of a conductive material as mentioned above. The glossiness here may be adjusted properly in accordance with the size and smoothness of each of particles on the surface of the plating film; and the brightener used in the plating solution or the like, and may be about 0.1 to 0.4, preferably about 0.1 to 0.35, and more preferably about 0.2 to 0.33 (measured by, for example, a densitometer GAM Model RD-144 manufactured by Electroplating Engineers Co., Japan). Also, the plating film is formed preferably of an alloy containing two metals of Sn and Cu, more preferably of an alloy containing Sn and 90 wt % or less of Cu, and still more preferably of an alloy containing Sn and 1 to 5 wt % of Cu. Further, preferably the plating film is about 8 to 20 $\mu$m thick, and more preferably there are particles of Cu or an Sn—Cu alloy with a 1 $\mu$m or less diameter dispersed uniformly in the plating film.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Now, there will now be explained in detail embodiments of a method for forming a plating film and an electronic component having a plating film formed thereon in accordance with the present invention based on the drawings. It should be understood that the present invention is not limited to the embodiment.

Embodiment 1

First, a photoreceptor and a light emitting element are respectively die-bonded by an Ag paste to lead frames of Cu, a Cu alloy or a Fe alloy as a base material. The photoreceptor and the light emitting element are respectively wire-bonded to the adjacent lead frames by gold wires.

Next, the light emitting element is precoated with a silicone resin for reduction of stress, and then the lead frames having the elements die-bonded thereto are spot-welded to position the photoreceptor and the light emitting element in an opposing relation. Then, primary transfer molding is carried out using a light transmitting epoxy resin to form an inner package such that an optical path is formed from the light emitting element to the photoreceptor. Subsequently, excess resin that has been leaked outside is deburred, as indicated in step 1-1 of FIG. 1 and secondary transfer molding is carried out using a light shielding resin to form an outer package such that optical signals can be transmitted from the light emitting element to the photoreceptor without entrance of disturbance light nor leakage of light from inside.

Then, the package is subjected to degreasing (step 1-2), rinsing, (step 1-3), etching (step 1-4), again rinsing (step 1-5), activation (step 1-6) using acid and further again rinsing (step 1-7) to clean the package, and then a plating film for exterior is formed on the lead frames of a packaged semiconductor device (step 1-8).

Figure 2:
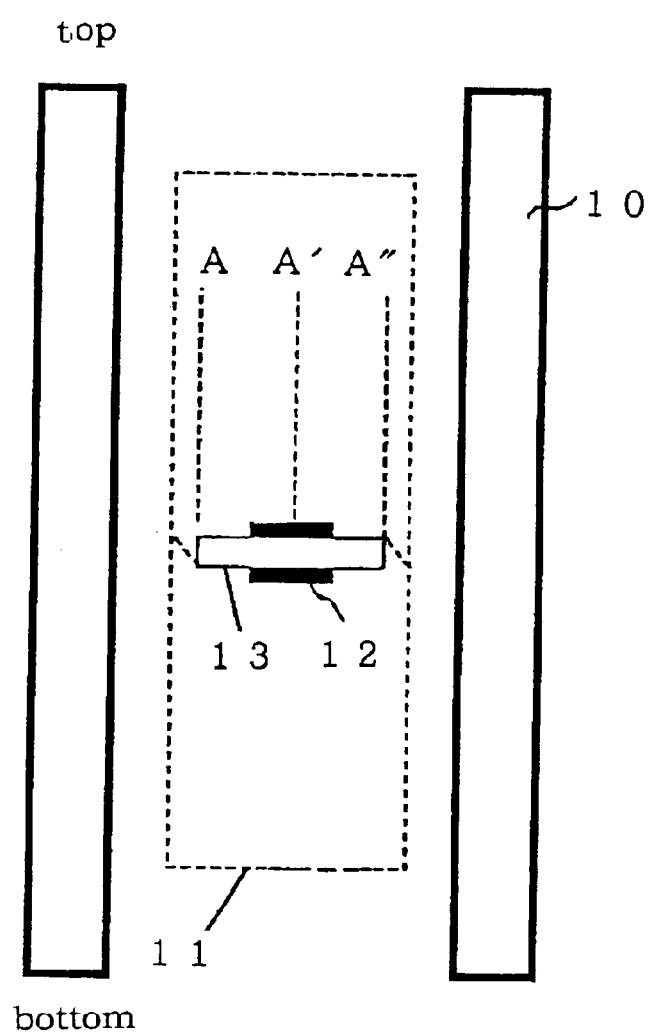
FIG. 2 is a schematic cross sectional view of an essential part for showing an arrangement of anodes, a cathode and an object to be plated in the method for forming a plating film in accordance with the present invention.

Firstly, an alkanolsulfonic acid plating bath which contains a SnCu plating solution is prepared. The plating bath is constituted mainly by methanesulfonic acid, adjusted the concentrations of Sn and Cu to have Cu at 1 to 5 wt % in the plating bath and added an additive FCM-10 (manufactured by Yuken Industries, Co., Japan) of about 30 to 50 ml/l (preferably about 35 to 45 ml/l) for example as well as a chelating agent (manufactured by Yuken Industries, Co.) for inhibiting anodic substitution of divalent Cu after the preparation of the plating solution. Then, a semiconductor device 12 having a lead frame 13 mounted on a cathode rack 11 is immersed into the obtained plating bath between a pair of anodes 10 for about 7 to 8 minutes, as shown in FIG. 2, while applying a current density of about 4.0 to 5.0 A/dm$^2$ to the cathode rack 11 during the immersion. Thus, a non-glossy plating film of a thickness of about 15 μm is formed on a surface of the lead frame.

Next, rinsing (step 1-9) and then neutralization (step 1-10) are carried out. As the neutralizing solution here, there is used a trisodium phosphate ($Na_3PO_4$) solution at a concentration of about 10 wt % and a temperature of about 55 to 65° C., into which the lead frame is immersed for 20 to 40 minutes.

Thereafter, thermal rinsing (step 1-11), draining (step 1-12) and drying (step 1-13) are carried out to obtain a semiconductor device where the plating film is formed on the lead frame.

Figure 3:
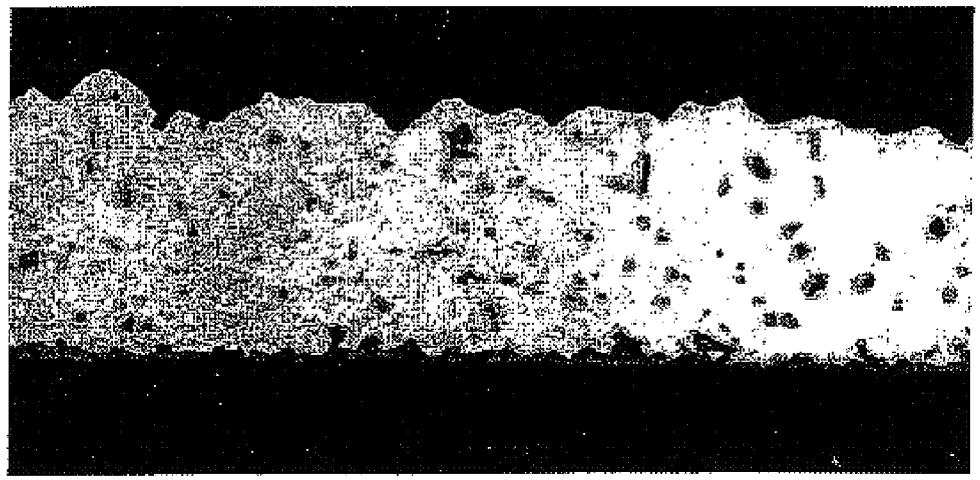
FIG. 3 is a cross sectional view of a plating film formed by the method for forming a plating film in accordance with the present invention.

In the plating film provided on the lead frame by such a method, the unevenness at its surface is alleviated and small particles of Cu or an Sn—Cu alloy with a diameter of 1 μm or less are uniformly dispersed in the non-glossy, single-layered SnCu plating film, as shown in FIG. 3.

For comparison, another plating film was formed by preparing an alkanolsulfonic acid plating bath which contains a SnCu plating solution; adjusting the concentrations of Sn and Cu to have Cu at 1 to 5 wt % in the plating bath; properly adding an additive different from FCM-10 as well as a chelating agent; immersing a semiconductor device into the plating solution at a current density of about 6.0 to 7.0 A/dm$^2$ for about 7 to 8 minutes; and carrying out neutralization using trisodium phosphate at a temperature of about 20 to 25° C. Thus, a plating film is obtained about 8 to 20 μm thick.

Figure 4:
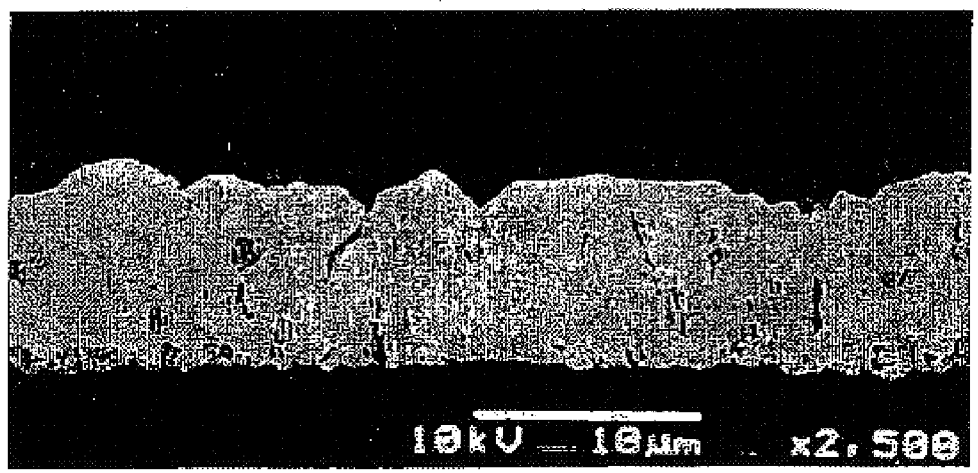
FIG. 4 is a cross sectional view of a plating film for comparison with that in FIG. 3.

In the plating film provided by such a method, the unevenness developed on its surface and particles of Cu or an Sn—Cu alloy with a maximum diameter of about 4 μm were formed, as shown in FIG. 4.

Also, solderability was evaluated with respect to semiconductors where plating films are formed on lead frames by the same method as that used for the above-mentioned plating film.

For the evaluation of solderability, a sample of a substrate-mounting type (component which is solderable by inserting a lead frame terminal into a predetermined hole in a printed substrate) and a sample of a surface-mounting type (component which has a terminal bent horizontally to a surface of a printed substrate so that the component can be soldered to a wiring on the printed surface by reflow soldering or the like) were pretreated by allowing both samples to stand at 100° C. and at 100% RH for 8 hours using an acceleration steam aging apparatus, or to subject at 105° C. and at 100% RH for 8 hours on PCT (Pressure Cooker Test) and then allowing them to stand at a room temperature for two hours or more, as described in attachment A of JIS0050. After the pretreatment, an equilibrium method EIAJ ET-7401 and a quick heating method EIAJ ET-7404 were applied to the substrate-mounting type sample and surface-mounting type sample, respectively.

Also, $Sn_{2.5}Ag_{0.5}Cu_{1.0}Bi$ was used as solder and the heating temperature of the solder was set to 245° C.

It was found that the zero cross time was 3 seconds or less.

Embodiment 2

Figure 5A:
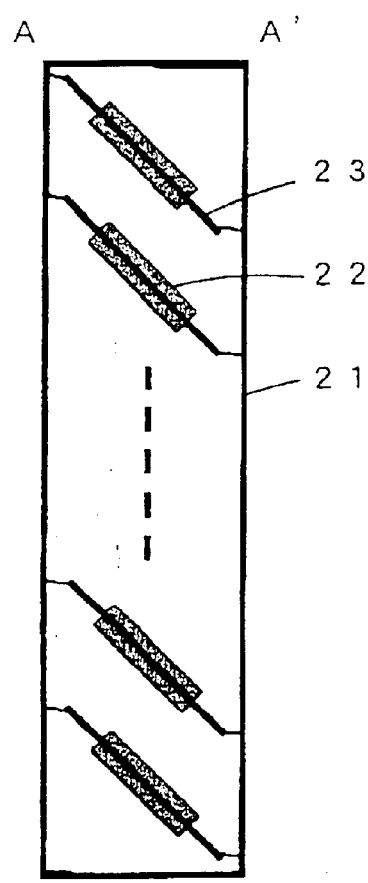
FIGS. 5(a) and (b) are schematic cross sectional views of an essential part for showing an arrangement of anodes, cathodes and objects to be plated in the method for forming a plating film in accordance with the present invention.
Figure 5B:
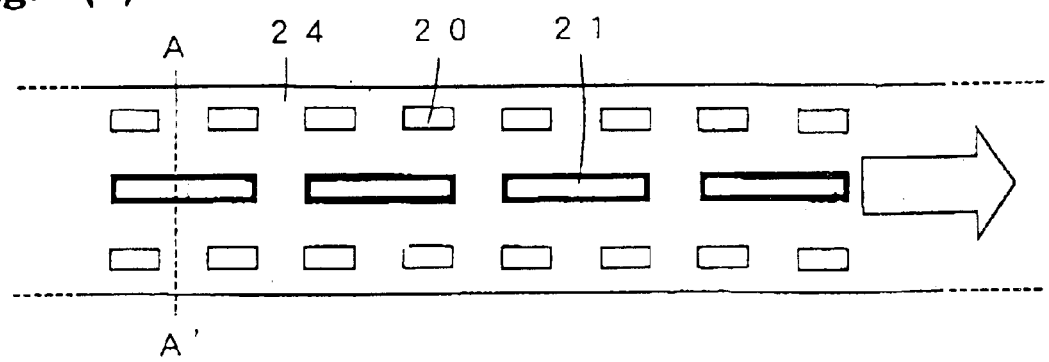

A semiconductor device 22 having a lead frame 23, which is the same lead frame as that in Embodiment 1, is mounted on a cathode rack 21, as shown in FIG. 5(a), and immersed into a same plating bath 24, which is the same plating bath as that in Embodiment 1. In the plating bath 24, the cathode rack 21 is immersed at a region between anodes 20 while electric power is supplied to the cathode rack 21 to plate at the region for a predetermined period; and then transferred to an adjacent cathode region to plate, as shown in FIG. 5(b).

Then, when the cathode rack 21 reached a last cathode region, the current density to the cathode rack 21 is changed to about 2.5 A/dm$^2$ and the cathode rack 21 is transferred at a constant rate for about 1 to 2 minutes to obtain a non-glossy plating film of a thickness of about 15 μm on the lead frame 23.

Also in the thus obtained plating film, small particles of an Sn—Cu alloy with a diameter of 1 μm or less are uniformly dispersed to allow the plating film to have a dense surface, as shown in FIG. 3.

Embodiment 3

Figure 6A:
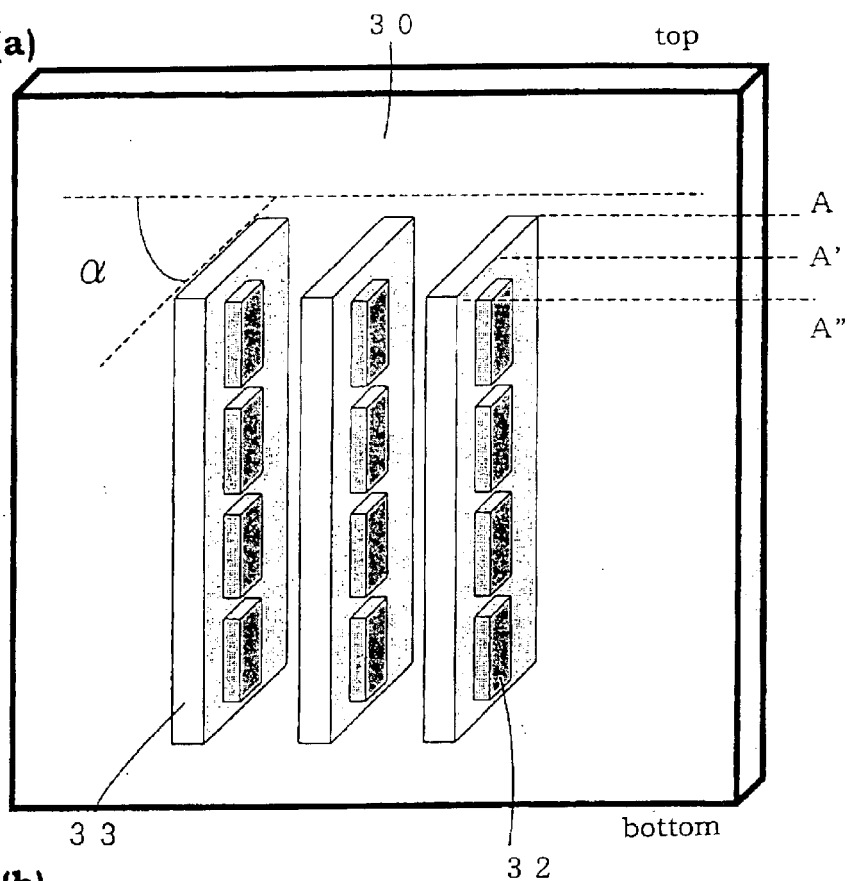
FIGS. 6(a) and (b) are schematic cross sectional views of an essential part for showing an arrangement of an anode, a cathode and objects to be plated in the method for forming a plating film in accordance with the present invention.
Figure 6B:
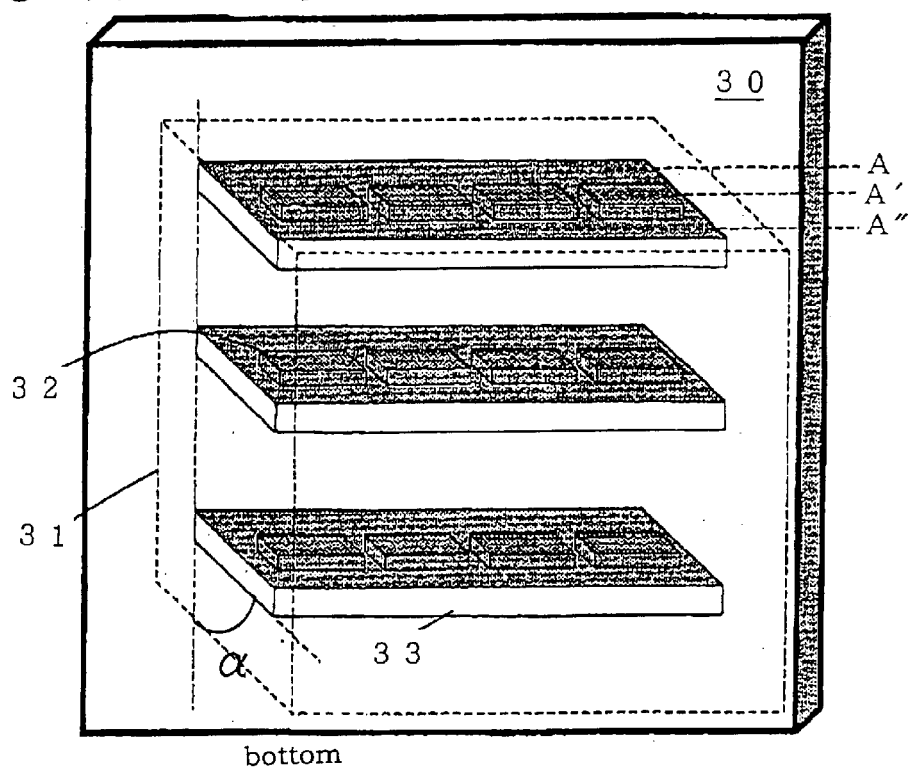
Figure 7:
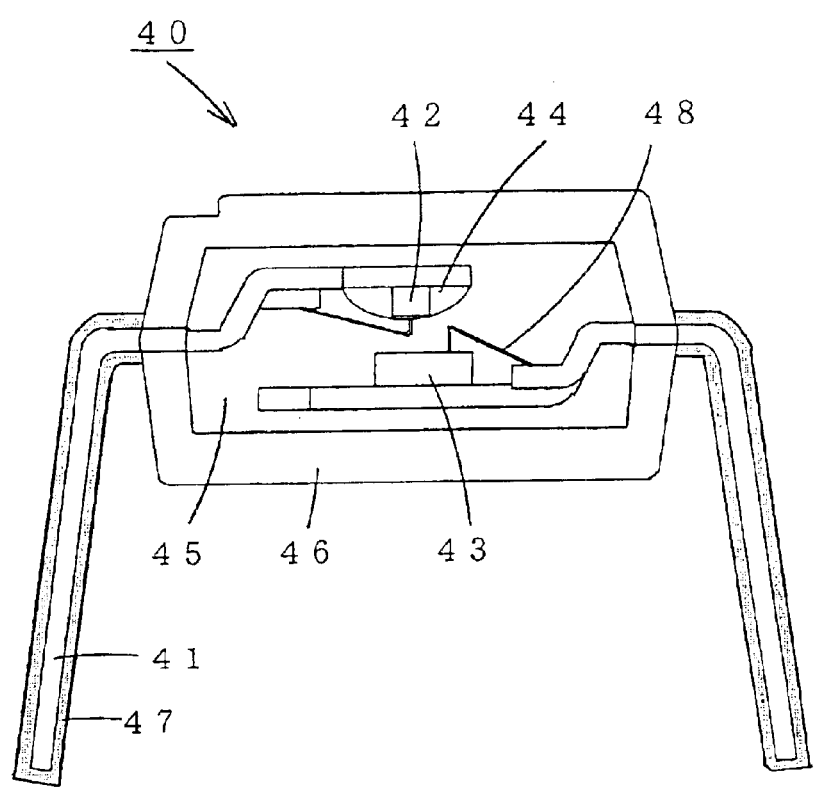
FIG. 7 is a schematic cross sectional view of an electronic component having a plating film formed thereon.

Plating films are formed in the same manner as in Embodiments 1 and 2, except that semiconductor devices 32 having lead frames are mounted on a cathode rack 31 such that a predetermined angle of, for example, 50° is formed between the semiconductor devices 32 and an anode 30, as shown in FIGS. 6(a) and (b). Also, in a projection of the lead frames 33 to the anode 30, an overlapping area of two adjacent lead frames makes up a third or less of all the projection area of one lead frame. This makes it possible to form, while considering mass production, a plating film of a predetermined thickness owing to an electrodeposition effect that allows plating to proceed also at a portion where adjacent lead frames appear to overlap.

In other words, generally, the lead frames, i.e., objects to be plated are mounted on the cathode rack substantially perpendicular to or substantially in parallel with the anode for plating the lead frames. Mounting the lead frames perpendicularly to the anode can secure mass production but generally produces a tendency of the plating film thickness to be thicker in a region nearer to the anode (region A or A" in FIG. 2) and thinner in a region more distant from the anode (region A' in FIG. 2). As the distance from region A to region A" is increased, the unevenness of the plating film thickness will be increased. On the other hand, mounting the lead frames in parallel to the anode decreases the number to be treated of lead frames but can inhibit the unevenness of the plating film thickness.

In comparison, this embodiment is advantageous in that while the productivity of the lead frames, i.e., plate-shaped objects to be plated is enhanced, there can be obtained a SnCu plating film of high quality which is excellent in solderability even with minimized unevenness in thickness.

The present invention makes it possible to improve solderability of a plating film for conventional lead-free solder by a simple method, which allows the productivity to further enhanced, resulting in a plating film with reduced production costs. Especially, where the object to be plated is plated at current densities in two levels, or where a plating film is applied and then the object to be plated is immersed into a solution containing 5 to 10 wt % of trisodium phosphate, a more uniform plating film can be obtained and thereby solderability of the plating film for solder can be promoted.

Especially, where the object to be plated is opposed to the anode such that a tilt angle of 5 to 85° is made therebetween for plating, or where a plurality of objects to be plated which are disposed close to one another are opposed to the anode such that in a projection of the objects to be plated to the anode, an overlap area of two adjacent objects to be plated makes up a third or less of all the projection area of one object to be plated, the unevenness of a plating film thickness depending on regions of the plating film can be inhibited, which makes it possible to form a plating film that satisfies solderability to a greater extent.

Also, as a result of a research on lead-free solder especially using an SnCu plating film, it has been found that particles of Cu or an Sn—Cu alloy with a 2 µm or less diameter are non-uniformly present (abnormally deposited) in a non-glossy SnCu plating film which is poor in solderability to damage solderability, but present invention enables particles of Cu or an Sn—Cu alloy which are of a diameter of about 1 µm or less to be uniformly dispersed and deposited so that the resulting SnCu plating film can provide remarkably improved solderability. Further, it has been found that a plating film having a thinner region (<8 µm) suffers from inconsistencies in solderability, but the present invention makes it possible to obtain a plating film of an uniform thickness and therefore to provide further improved solderability. Moreover, it has been found that a plating film with a less roughened and more dense surface tends to provide favorable solderability, and the present invention makes it possible to obtain a plating film having a dense surface and therefore to provide further improved solderability.

What is claimed is:

1. A method for forming a plating film, comprising the steps of:

applying a plating film onto an abject to be plated at a first current density for a predetermined period in a plating bath having a cathode capable of varying current and an anode; and maintaining the object to be plated at a second current density lower than the first current density; and neutralizing the object to be plated with a trisodium phosphate solution.

2. A method of claim 1, further comprising neutralizing the object to be plated with a trisodiun phosphate solution containing 5 to 10% wt of trisodium phosphate.

3. A method for forming a plating film comprising the steps of:

applying a plating film onto an object to be plated at a first current density for a predetermined period in a plating bath having a cathode and an anode; and treating for neutralizing the object to be plated with a solution containing 5 to 10% wt of trisodium phosphate.

4. A method of claim 1, wherein the first current density is 1 to 5 A/dm$^2$.

5. A method of claim 1, wherein the second current density is 0.5 to 45 A/dm$^2$.

6. A method of claim 3, wherein the temperature of the trisodium phosphate solution is 25 to 65° C.

7. A method of claim 1, wherein the object to be plated is opposed to the anode such that a tilt angle of 5 to 85° of the object to be plated is made with respect to the anode for plating.

8. A method of claim 7, wherein a plurality of objects to be plated which are disposed close to one another are opposed to the anode such that in a projection of the plurality of objects to be plated to the anode, an overlapping area of two adjacent lead frames makes up a third or less of the total projection area of one lead frame.

9. A method of claim 3, wherein the object to be plated is opposed to the anode such that a tilt angle of 5 to 85° of the object to be plated is made with respect to the anode for plating.

10. A method of claim 2, wherein the first current density is 1 to 5 A/dm$^2$.

11. A method of claim 4, wherein the second current density is 0.5 to 4.5 A/dm$^2$.

12. A method of claim 2, wherein the temperature of the trisodium phosphate solution is 25 to 65° C.

13. A method for forming a plating film comprising the steps of:

applying a plating film onto an object to be plated at a first current density for a predetermined period in a plating bath having a cathode and an anode; and treating for neutralizing the object to be plated with a trisodium phosphate solution.

* * * * *